US012025684B2

(12) United States Patent
Chmielewski et al.

(10) Patent No.: US 12,025,684 B2
(45) Date of Patent: Jul. 2, 2024

(54) RF COIL ASSEMBLIES

(71) Applicant: ViewRay Systems, Inc., Denver, CO (US)

(72) Inventors: Thomas Chmielewski, Aurora, OH (US); Steven Koenig, Solon, OH (US)

(73) Assignee: ViewRay Systems, Inc., Denver, CO (US)

( * ) Notice: Subject to any disclaimer, the term of this patent is extended or adjusted under 35 U.S.C. 154(b) by 0 days.

(21) Appl. No.: 17/880,326

(22) Filed: Aug. 3, 2022

(65) Prior Publication Data
US 2023/0041633 A1 Feb. 9, 2023

Related U.S. Application Data

(60) Provisional application No. 63/229,455, filed on Aug. 4, 2021.

(51) Int. Cl.
G01R 33/34 (2006.01)
G01R 33/3415 (2006.01)

(52) U.S. Cl.
CPC ... *G01R 33/34053* (2013.01); *G01R 33/3415* (2013.01)

(58) Field of Classification Search
CPC .......... G01R 33/34053; G01R 33/3415; G01R 33/445; G01R 33/34007; G01R 33/365
See application file for complete search history.

(56) References Cited

U.S. PATENT DOCUMENTS

| 4,680,548 | A |   | 7/1987  | Edelstein |
|-----------|---|---|---------|-----------|
| 4,774,468 | A | * | 9/1988  | Bydder ............ G01R 33/34061 324/318 |
| 4,812,761 | A |   | 3/1989  | Vaughan, Jr. |
| 4,831,330 | A |   | 5/1989  | Takahashi |
| 5,184,076 | A |   | 2/1993  | Ehnholm |
| 5,477,146 | A |   | 12/1995 | Jones |
| 5,565,778 | A | * | 10/1996 | Brey ...................... G01R 33/34 324/318 |
| 5,594,342 | A | * | 1/1997  | Brey .................. G01R 33/3628 324/318 |

(Continued)

FOREIGN PATENT DOCUMENTS

| CN | 1969194 A | 5/2007 |
| CN | 101438959 A | 5/2009 |

(Continued)

OTHER PUBLICATIONS

International Search Report issued in corresponding international application No. PCT/US2014/024354 dated Jun. 12, 2014.

(Continued)

*Primary Examiner* — G. M. A Hyder
(74) *Attorney, Agent, or Firm* — Davis Graham & Stubbs LLP

(57) ABSTRACT

RF coil assemblies are disclosed that include multiturn loops formed of conductors configured to receive RF signals from a patient during MRI. The multiturn loops include an inner loop and an outer loop that both lie substantially in a plane of the RF coil assembly. The inner loop is at least partially nested within the outer loop.

25 Claims, 8 Drawing Sheets

(56) References Cited

U.S. PATENT DOCUMENTS

| | | | |
|---|---|---|---|
| 5,619,140 A * | 4/1997 | Brey | H01G 4/40 |
| | | | 324/318 |
| 5,621,323 A | 4/1997 | Larsen | |
| 5,990,681 A | 11/1999 | Richard | |
| 6,060,882 A | 5/2000 | Doty | |
| 6,100,694 A | 8/2000 | Wong | |
| 6,177,797 B1 | 1/2001 | Srinivasan | |
| 6,198,957 B1 | 3/2001 | Green | |
| 6,316,941 B1 | 11/2001 | Fujita | |
| 6,366,798 B2 | 4/2002 | Green | |
| 6,369,570 B1 | 4/2002 | Wong | |
| 6,396,271 B1 | 5/2002 | Burl | |
| 6,420,871 B1 | 7/2002 | Wong | |
| 6,624,632 B2 | 9/2003 | Iriguchi | |
| 6,930,480 B1 | 8/2005 | Fujita | |
| 7,084,629 B2 | 8/2006 | Monski, Jr. | |
| 7,221,161 B2 | 5/2007 | Fujita | |
| 7,268,554 B2 | 9/2007 | Vaughan | |
| 7,282,915 B2 * | 10/2007 | Giaquinto | G01R 33/3415 |
| | | | 324/318 |
| 7,397,246 B2 | 7/2008 | Freytag | |
| 7,855,559 B2 | 12/2010 | DeFranco | |
| 7,907,987 B2 | 3/2011 | Dempsey | |
| 7,911,209 B2 | 3/2011 | Alradady | |
| 8,022,705 B2 | 9/2011 | Bogdanov | |
| 8,035,384 B2 | 10/2011 | Saha | |
| 8,129,992 B2 | 3/2012 | Cork | |
| 8,217,653 B2 | 7/2012 | Vaughan | |
| 8,331,531 B2 | 12/2012 | Fahrig | |
| 8,427,158 B2 | 4/2013 | Huish | |
| 8,497,682 B2 | 7/2013 | Huish | |
| 8,704,520 B2 | 4/2014 | Saha | |
| 8,710,843 B2 | 4/2014 | Carlone | |
| 9,404,983 B2 | 8/2016 | Dempsey | |
| 9,664,763 B2 | 5/2017 | Amthor | |
| 10,107,878 B2 | 10/2018 | Habara | |
| 10,466,319 B2 | 11/2019 | Dempsey | |
| 2001/0001807 A1 | 5/2001 | Green | |
| 2003/0071621 A1 | 4/2003 | Watkins | |
| 2003/0122546 A1 * | 7/2003 | Leussler | G01R 33/341 |
| | | | 324/318 |
| 2003/0146750 A1 | 8/2003 | Vaughan | |
| 2003/0193380 A1 | 10/2003 | de Swiet | |
| 2004/0140808 A1 | 7/2004 | Vaughan | |
| 2005/0062472 A1 | 3/2005 | Bottomley | |
| 2005/0099179 A1 | 5/2005 | Monski, Jr. | |
| 2005/0231201 A1 | 10/2005 | Fujimoto | |
| 2006/0033497 A1 | 2/2006 | Chmielewski | |
| 2006/0033501 A1 | 2/2006 | Vaughan, Jr. | |
| 2006/0273795 A1 | 12/2006 | Rieke | |
| 2007/0007964 A1 | 1/2007 | Vaughan, Jr. | |
| 2007/0016003 A1 | 1/2007 | Piron | |
| 2007/0159170 A1 | 7/2007 | Freytag | |
| 2007/0216409 A1 | 9/2007 | Overweg | |
| 2007/0247158 A1 | 10/2007 | Nistler | |
| 2007/0247160 A1 | 10/2007 | Vaughan, Jr. | |
| 2008/0088309 A1 | 4/2008 | Eberler | |
| 2008/0094063 A1 | 4/2008 | Renz | |
| 2008/0100297 A1 * | 5/2008 | Ishii | G01R 33/3621 |
| | | | 324/322 |
| 2008/0129296 A1 | 6/2008 | Fischer | |
| 2008/0275332 A1 | 11/2008 | Alradady | |
| 2008/0278167 A1 | 11/2008 | Vaughan, Jr. | |
| 2008/0306377 A1 | 12/2008 | Piron | |
| 2009/0009169 A1 | 1/2009 | Schulz | |
| 2009/0021256 A1 | 1/2009 | Soutome | |
| 2009/0134873 A1 | 5/2009 | Cho | |
| 2009/0134875 A1 | 5/2009 | Tomiha | |
| 2009/0149735 A1 | 6/2009 | Fallone | |
| 2009/0237077 A1 | 9/2009 | Vaughan | |
| 2010/0079139 A1 | 4/2010 | Defranco | |
| 2010/0102811 A1 | 4/2010 | Demas | |
| 2010/0164494 A1 | 7/2010 | Koretsky | |
| 2010/0239066 A1 | 9/2010 | Fahrig | |
| 2010/0253333 A1 | 10/2010 | Zhai | |
| 2010/0253338 A1 | 10/2010 | Eryaman | |
| 2010/0253350 A1 | 10/2010 | Huish | |
| 2010/0253351 A1 | 10/2010 | Huish | |
| 2011/0012593 A1 | 1/2011 | Shvartsman | |
| 2011/0043207 A1 | 2/2011 | Gross | |
| 2011/0125005 A1 | 5/2011 | Misic | |
| 2011/0166437 A1 | 7/2011 | Chang | |
| 2011/0215807 A1 | 9/2011 | Misic | |
| 2012/0146643 A1 | 6/2012 | Saha | |
| 2012/0150017 A1 | 6/2012 | Yamaya | |
| 2012/0184841 A1 | 7/2012 | Nielsen | |
| 2012/0268132 A1 | 10/2012 | Zhu | |
| 2012/0286786 A1 | 11/2012 | Schellekens | |
| 2012/0286921 A1 * | 11/2012 | Wang | G01R 33/3635 |
| | | | 336/84 R |
| 2013/0027040 A1 | 1/2013 | Alagappan | |
| 2013/0035584 A1 | 2/2013 | Fahrig | |
| 2013/0131433 A1 | 5/2013 | Katscher | |
| 2013/0165770 A1 | 6/2013 | Li | |
| 2014/0043027 A1 | 2/2014 | Overweg | |
| 2014/0084926 A1 | 3/2014 | Amthor | |
| 2014/0125339 A1 | 5/2014 | Lee | |
| 2014/0128719 A1 | 5/2014 | Longfield | |
| 2014/0167758 A1 | 6/2014 | Sambandamurthy | |
| 2014/0191757 A1 | 7/2014 | Randell | |
| 2014/0221816 A1 | 8/2014 | Franke | |
| 2014/0253126 A1 | 9/2014 | Habara | |
| 2014/0266206 A1 | 9/2014 | Dempsey | |
| 2014/0275962 A1 | 9/2014 | Foo | |
| 2015/0054506 A1 | 2/2015 | Eberler | |
| 2015/0112187 A1 | 4/2015 | Petropoulos | |
| 2015/0177346 A1 | 6/2015 | Mazurewitz | |
| 2015/0217136 A1 | 8/2015 | Stanescu | |
| 2016/0146911 A1 | 5/2016 | Chmielewski | |
| 2016/0216344 A1 | 7/2016 | Habara | |
| 2017/0299671 A1 | 10/2017 | Holle | |
| 2017/0307704 A1 | 10/2017 | Leussler | |
| 2018/0299520 A1 | 10/2018 | Piron | |
| 2019/0310330 A1 * | 10/2019 | Yang | G01R 33/34084 |
| 2019/0353724 A1 | 11/2019 | Snelten | |
| 2020/0041587 A1 | 2/2020 | Findeklee | |
| 2021/0302514 A1 | 9/2021 | Yang | |
| 2022/0120831 A1 * | 4/2022 | Yang | G01R 33/34084 |

FOREIGN PATENT DOCUMENTS

| | | |
|---|---|---|
| CN | 102711915 A | 10/2012 |
| CN | 102713682 A | 10/2012 |
| EP | 2345906 A1 | 7/2011 |
| EP | 2523011 A1 | 11/2012 |
| EP | 2589976 | 5/2013 |
| GB | 2424281 A | 9/2006 |
| JP | 2002102207 | 4/2002 |
| JP | 2009142646 A | 8/2009 |
| JP | 2012511382 | 5/2012 |
| JP | 2012236018 A | 12/2012 |
| WO | 2005124379 A1 | 12/2005 |
| WO | 2008122899 A1 | 10/2008 |
| WO | 2009013650 A2 | 1/2009 |
| WO | 2011063342 A1 | 5/2011 |
| WO | 2011148278 | 12/2011 |

OTHER PUBLICATIONS

PCT/IB2022/057231 International Search Report and Written Opinion dated Nov. 14, 2022 (11 pages).

* cited by examiner

RF COIL ASSEMBLIES

RELATED APPLICATION(S)

This application claims priority to and the benefit of U.S. Provisional Application No. 63/229,455, filed Aug. 4, 2021, titled "RF Coil Assemblies," which is hereby incorporated by reference.

DESCRIPTION OF THE RELATED ART

Magnetic resonance imaging (MRI), or nuclear magnetic resonance imaging, is a noninvasive imaging technique that uses the interaction between radio frequency pulses, a strong magnetic field (modified with weak gradient fields applied across it to localize and encode or decode phases and frequencies) and body tissue to obtain projections, spectral signals, and images of planes or volumes from within a patient's body. RF coils may be used to excite atoms in patient tissues to emit RF radiation that may then be detected by RF coils (in the form of varying magnetic flux through the RF coil) and used to reconstruct an image of the patient. Magnetic resonance imaging is particularly helpful in the imaging of soft tissues and may be used in the diagnosis and treatment of disease. Real-time or cine MRI may be used for the diagnosis of medical conditions requiring the imaging of moving structures within a patient. Real-time MRI may also be used in conjunction with interventional procedures, such as radiation therapy or image guided surgery.

SUMMARY

RF coil assemblies and their use with MRI systems are disclosed. Some implementations of an RF coil assembly include multiturn loops formed of conductors configured to receive RF signals from a patient during MRI. The multiturn loops include an inner loop and an outer loop that both lie substantially in a plane of the RF coil assembly, the inner loop at least partially nested within the outer loop.

In some variations, the inner loop and outer loop may form a spiral shape The multiturn loops can include a first multiturn loop and a second multiturn loop where the outer loops in each are formed from a common conductor. The first multiturn loop can be adjacent a second multiturn loop. A passive isolation circuit can be disposed in the common conductor to electromagnetically isolate the first multiturn loop and the second multiturn loop.

In other variations, the RF coil assembly can include a first multiturn loop and a third multiturn loop can that is not adjacent the first multiturn loop. An inductor pair can be connected between the first multiturn loop and the third multiturn loop to electromagnetically isolate the first multiturn loop and the third multiturn loop.

In some variations, the multiturn loops form a phased array coil. The RF coil assembly can be part of a surface coil or a head coil.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to particular implementations, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

RF coils can be utilized in Magnetic Resonance Imaging (MRI) to receive signals that may be used for constructing images of the internal anatomy of a patient. While many conventional MRI machines attempt to operate at higher magnetic field strengths (1.5T and above) in order to obtain improved RF signals during imaging, other systems, such as those contemplated for use with the RF coils of the present disclosure, may be suited to operate at lower magnetic field strengths (e.g., less than 1.0T, approximately 0.5T or approximately 0.35 T). Advantages of low-field MRI can include, for example, reduced patient heating, reduced artifacts, smaller and less expensive MRI magnets, improved safety, etc. Accordingly, the present disclosure provides improvements to RF coil technology that facilitate imaging at lower magnetic fields by having a more sensitive detection system. However, while the disclosed embodiments facilitate low-field MRI, similar advantages can be realized at any MRI field strength. Thus, the disclosed system should not be considered limited to only low-field MRI applications.

Figure 1:
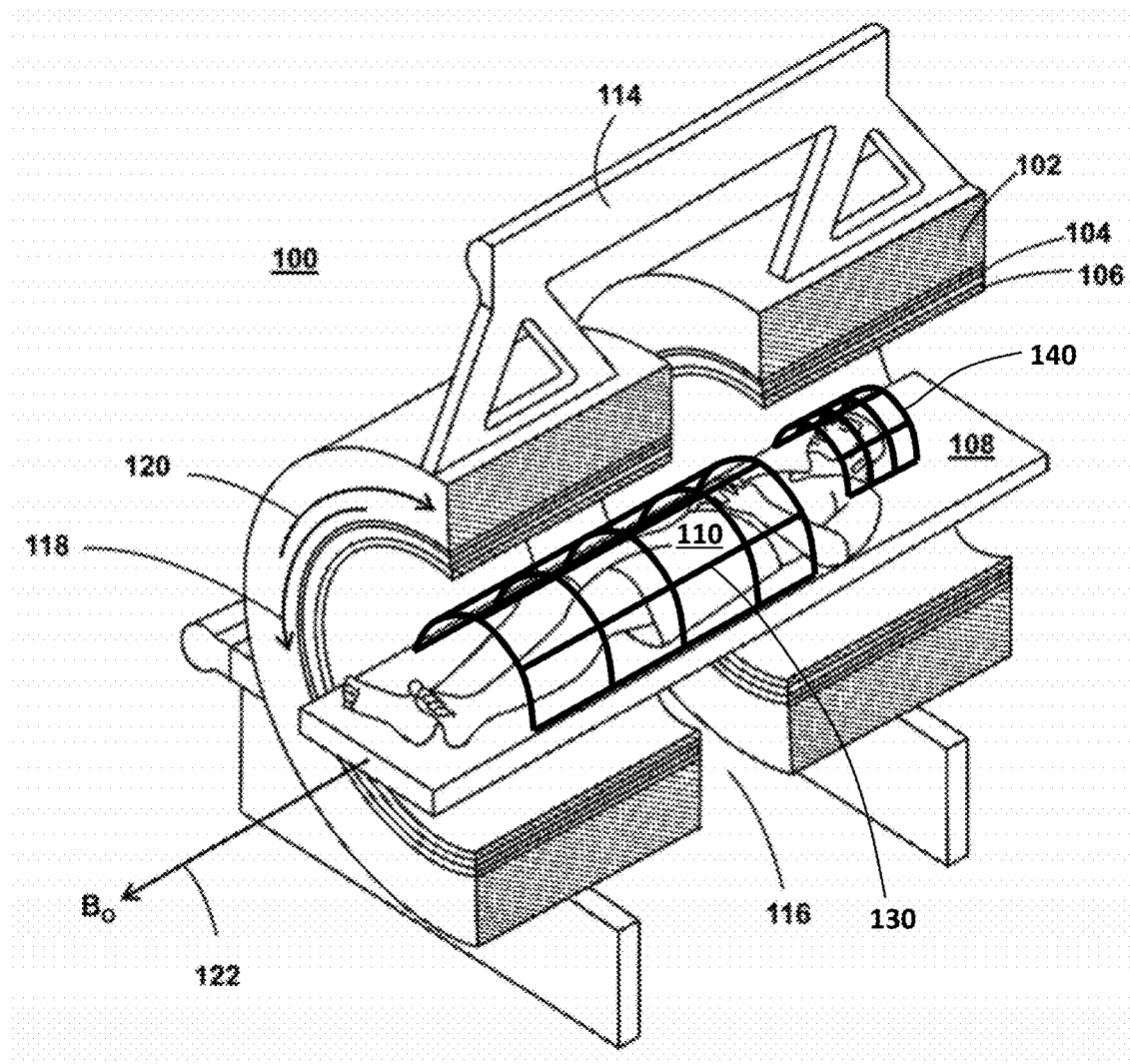
FIG. 1 illustrates one implementation of a magnetic resonance imaging system (MRI) consistent with certain aspects of the present disclosure.

FIG. 1 illustrates one implementation of a magnetic resonance imaging system (MRI) 100 consistent with certain aspects of the present disclosure. In FIG. 1, the MRI 100 includes a main electromagnet 102, a gradient coil assembly 104 and an RF coil system 106. Within MRI 100 is a patient couch 108 on which a human patient 110 may lie.

The main electromagnet 102 of MRI 100 may be a gapped solenoidal electromagnet separated by buttresses 114 with a gap 116 as shown in FIG. 1. A "gap," as the term is used herein, refers to the type of solenoidal magnet gap 116 depicted in FIG. 1; it does not refer to the open space in a dipolar magnet arrangement where the patient is positioned for imaging. In one implementation, gap 116 shown in FIG. 1 is 28 cm. As also depicted in FIG. 1, the currents in the main electromagnet 102 may be in either a first direction 118 or a second direction 120, to generate the main magnetic field Bo, shown along axis 122, with the direction of the field is dependent on the main electromagnet current direction.

Gradient coil assembly 104 contains the coils necessary to add small varying magnetic fields on top of the field of main electromagnet 102's field, in order to allow for spatial encoding of the imaging data. Gradient coil assembly 104 may be a continuous cylindrical assembly, a split gradient coil assembly as shown in FIG. 1, or other designs as may be necessary for the particular MRI configuration utilized.

Magnetic resonance imaging systems include control systems configured for the acquisition and processing of magnetic resonance imaging data from patient 110, including image reconstruction. Such control systems may contain numerous subsystems, for example, those which control operation of the gradient coil assembly 104, the RF coil system 106, portions of those systems themselves, and those that process data received from RF coil system 106 and perform image reconstruction. Additional control system functionality can be included, for example, when an interventional device (such as a radiation therapy device) is integrated with MRI 100.

FIG. 1 depicts three different types of RF coils which may be present in any combination. A body coil 106 can be an RF coil that is integrated into the MRI system and generally extends at least the length of a patient's body. The body coil may be utilized to provide RF signals for atomic excitations utilized when performing MRI and/or receive RF signals from the patient. Two other types of RF coils depicted in FIG. 1—a surface coil 130 and a head coil 140. Surface coil 130 can be a collection of RF coils that provide more localized and accurate detections of RF signals (and their varying magnetic flux) emanating from the patient during the MRI procedure. In some embodiments, the surface coil may be a blanket or a cage that is closer to the surface of the patient than the body coil. The last type of RF coil depicted in FIG. 1 is a head coil 140. The head coil may be similar to the surface coil in that it may be positioned closer to the patient but may also be shaped to primarily surround the patient's head. As such, head coil 140 may also be embodied as a cylindrical cage or other open structure to allow the patient's head to fit within. While the present disclosure provides improvements to RF head and/or surface coils, the features disclosed herein may be applied to MRI RF coil systems in general, including to RF body coils.

Figure 2A:
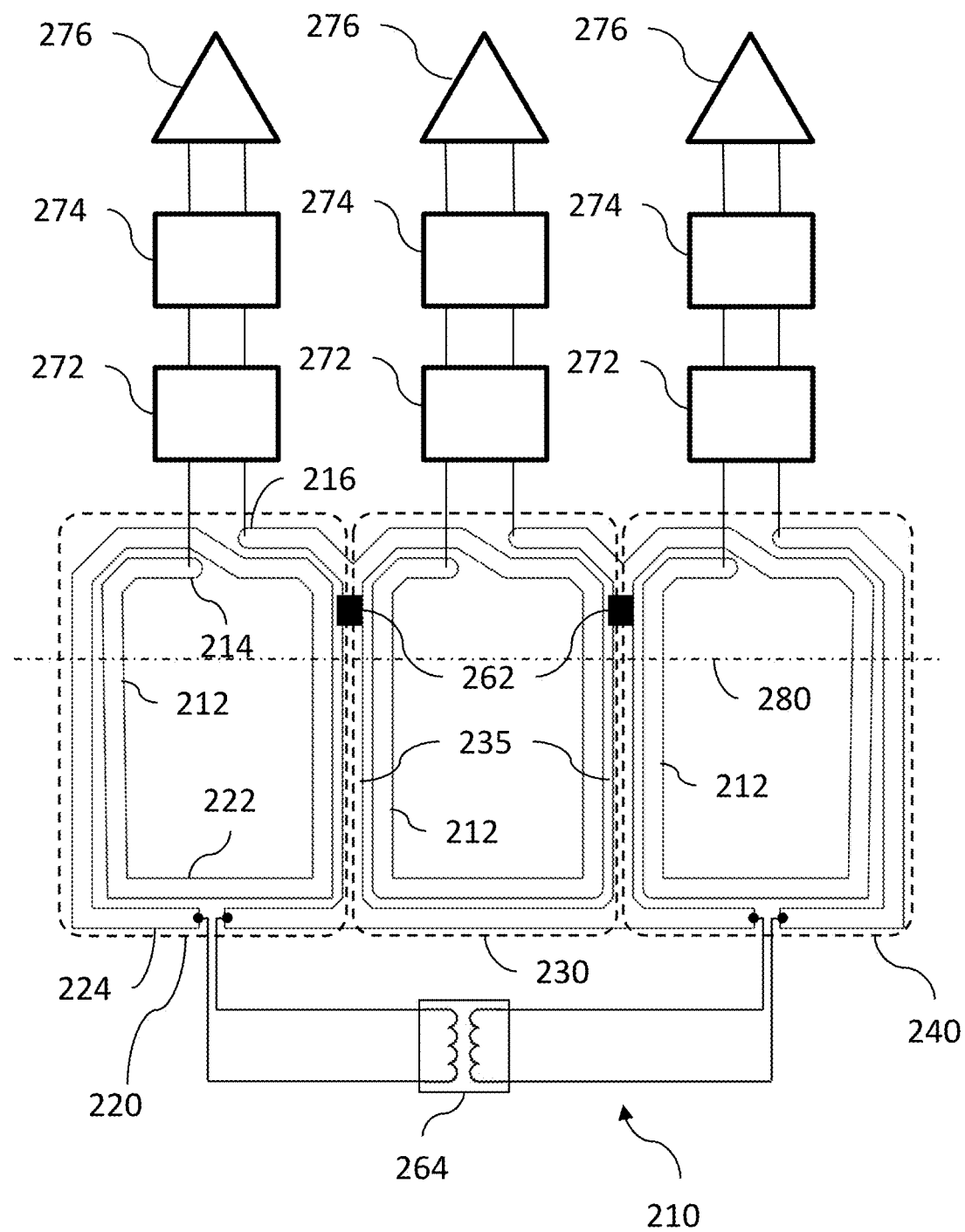
FIG. 2A illustrates one implementation of an RF coil assembly consistent with certain aspects of the present disclosure.

FIG. 2A illustrates one implementation of an RF coil assembly consistent with certain aspects of the present disclosure. In FIG. 2A, an example RF coil assembly 210 is depicted that can have multiturn loops (220, 230, 240) formed of conductors 212 configured to receive RF signals from a patient during MRI. Such conductors can act as an antenna to collect signals that are utilized in MRI image reconstruction. As demonstrated by the present disclosure, utilizing multiple turns can significantly increase the signal collected over the area enclosed by the multiturn loops.

The additional conductive material used with multiple loops can increase coil losses. However, one unexpected result of the disclosed embodiments is that the increase in collected signal outweighs any increased coil losses. For example, some embodiments of the RF coil assembly can collect approximately three times the amount of RF signal emitted from the patient, while only approximately doubling the coil losses. Thus, in certain embodiments, the resulting signal-to-noise ratio (SNR) can be approximately 35% higher than the corresponding assembly constructed with a single-turn loop.

For illustrative purposes, each of the multiturn loops (220, 230, 240) in FIG. 2A are denoted by a dashed boundary. It is understood that this boundary is not an actual structural feature but is provided to indicate the conductors that generally form a respective multiturn loop. The exemplary RF coil assembly depicted in FIG. 2A shows an embodiment where each of the multiturn loops have two loops, an inner loop 222 and an outer loop 224. However, it is understood that any number of turns (or loops) may be implemented, for example, 3, 5, 10, etc. In an example where there are three turns, an RF coil assembly can thus have a third loop at least partially nested within inner loop 222. In this way, the present disclosure further contemplates that the nested progression of loops can continue according to various designs. However, the particular number of turns may be selected to optimize the increase in SNR against coil losses, design complexity, expense of including additional material and the like. Thus, the present disclosure of a two turn multiturn loop is not merely an arbitrary design choice but is one example of a proven implementation that has been demonstrated to produce a significant improvement in SNR while having only a marginal impact on construction complexity.

As used herein, the term "loop" refers to a conductor arrangement that is substantially (though not necessarily completely) closed. A loop need not be made of a single conductor but may be comprised of any number of conductors. For example, in the first multiturn loop 220 depicted in FIG. 2A, inner loop 222 begins from inner terminal 214 and proceeds around to form a generally rectangular-shaped loop. However, rather than closing on itself, it proceeds outward to form outer loop 224, which continues until it reaches outer terminal 216. As such, the loops substantially enclose an area where RF signal is to be detected. For example, any particular loop may have at least 80%, 90%, or 95% enclosure of the area. However, 100% enclosure of such an area can be realized by conductors that may form part of another loop or may form a transition between two loops.

As used herein, the term "multiturn loop" refers to a conductor arrangement having at least two loops. This is illustrated by the dashed outline shown in FIG. 2A that generally encloses an arrangement of conductors where, in most locations, two conductors are crossed from the outer edge to the center.

As used herein, the term "turn" refers to the number of loops in a multiturn loop. For example, FIG. 2A depicts several multiturn loops each having two turns.

The RF coil assembly in FIG. 2A illustrates that in some embodiments, the inner loop and the outer loop (e.g., of multiturn loop 220) can be arranged in series. The term "series" means that the electrical current in the outer loop flows directly to the inner loop because the inner loop is a "series" continuation of the outer loop. In contrast, a "parallel" design may have a current split into an inner conductor and an outer conductor. Thus, the term "series" distinguishes over designs where "parallel" conductors may be used to have highly coupled coils with reduced inductance. It should be noted that the adjacent conductors used in the nested multiturn loops of the present disclosure are not considered "parallel" in certain embodiments at least because having an inner loop nested within the outer loop can increase the inductance of the RF coil assembly and such an increase in inductance is in contrast to possible parallel designs that act to reduce inductance.

In some embodiments, the inner and outer loops can both lie substantially in a plane of the RF coil assembly. An example of this is depicted in FIG. 2A, where the inner loop can be at least partially nested within the outer loop. As used herein, the terms "plane" or "planar" refer to what the physical layout would be were the given embodiment laid flat. For example, the surface coil 130 and head coil 140 in FIG. 1 are generally semicylindrical to conform to the shape of a patient. However, were such designs "laid flat" it can be seen how they would be considered planar as there are no stacked loops in the direction generally radial from the patient axis. In contrast, a "solenoidal" design is considered as one where conductors forming loops are on top of each other and thus the winding extends in a direction normal to the area of the loop. The terms plane or planar as used herein are also intended to include designs such as FIG. 4 where lying flat each of the plurality of multiturn loop assemblies (420 and 430) may not result in a perfectly flat plane (since the design is not perfectly cylindrical) but where the conductors within an assembly are nevertheless adjacent and not overlapping or solenoidal.

Embodiments of the disclosed planar RF coil assemblies can have a reduced parasitic capacitance as compared to many nonplanar designs. The present planar designs can be constructed of conductors that are thin in the direction normal to the plane of loop. The conductors utilized in the present disclosure can have a thickness of approximately 20 micrometers or, in other embodiments, may be up to 0.2 mm, or 0.4 mm, 1.0 mm, or greater than 1.0 mm. Examples of RF frequencies utilized with such conductors can be approximately 5-300 MHz. Very thin conductors can be utilized, having thicknesses of less than three, less than 5, or between 3-5 skin depths. For a radiotherapy application one may compromise a few skin depths in order to lower radiation attenuation. Parasitic capacitance between the conductors is very low due to the thinness of the nested conductors. Nevertheless, it is contemplated that in some embodiments a hybrid approach may be implemented where some loops are nested (i.e., in a plane) and where other loops may be stacked in a solenoidal configuration. Such hybrid designs would not be considered planar.

One example of a planar multiturn loop is depicted in FIG. 2A where the inner loop and the outer loop form a spiral shape. However, such a spiral shape need not be a conventional circular spiral but may instead be a variety of shapes, such as approximately rectangular (as shown), octagonal, circular, elliptical, or even irregular (i.e., not polygonal).

Electromagnetic isolation of a particular multiturn loop from other multiturn loops in the RF coil assembly can be performed by any combination of the isolation methods disclosed herein. As used herein, the term "electromagnetic isolation" refers to a general reduction in the electromagnetic coupling between any two particular loops. The degree to which the electromagnetic isolation reduces the coupling can vary depending on the particular coil geometry and/or the selection of electronic components utilized in a given implementation.

In some embodiments, common conductors between adjacent multiturn loops can be utilized to reduce electromagnetic coupling including, for example, passive isolation circuitry as described further below. For example, the multiturn loops of the RF coil assembly can have a first multiturn loop and a second multiturn loop, where the outer loops in each can be at least partially formed from a common conductor 235. In this way, at least a portion of the multiturn loops can be physically connected (i.e., made of the same uninterrupted conductor). In other embodiments, not every outer loop in the RF coil assembly need have a common conductor.

In some embodiments, as shown for example in FIG. 2A, the RF coil assembly can include a passive isolation circuit 262 that can be disposed in the common conductor 235 to electromagnetically isolate the first multiturn loop and the second multiturn loop. The passive isolation circuit can include any combination of capacitors, inductors, etc., to reduce the electromagnetic coupling between multiturn loops. In other embodiments, further decoupling may be implemented between multiturn loops that are not adjacent. In some embodiments, only a single capacitor is required.

In some embodiments, the RF coil assembly can include a first multiturn loop and a third multiturn loop that is not adjacent the first multiturn loop. An inductor pair 264 can be connected between the first multiturn loop and the third multiturn loop to electromagnetically isolate the first multiturn loop and the third multiturn loop. An inductor pair can be provided for any and/or all non-adjacent multiturn loops. For example, in an embodiment where there was a fourth multiturn loop, there could be inductor pairs between the first and third, first and fourth, and second and fourth multiturn coils. Also, it is contemplated that inductor pairs could be between adjacent elements.

In some embodiments, electronic decoupling elements (described in further detail below) can be located off of the RF coil assembly. The electronic decoupling elements can be connected to the RF coil assembly with wiring such as coaxial cables, braided wire, or the like. Such embodiments may be well-suited to radiation therapy applications where it may be advantageous to not have circuit elements in the path of radiation beam. For example, the dashed line in FIG. 2A indicates an example component boundary 280. Such a component boundary 280 can denote a region of the RF coil assembly where there may be no electronic decoupling elements, or a reduced number of electronic decoupling elements. The component boundary can thus delineate a portion of the RF coil assembly that may have reduced interference with delivery of a radiation beam.

Electronic decoupling elements that can be in any of the disclosed embodiments of the RF coil assembly can include an active detuning circuit 272, a matching capacitor 274, and a preamplifier 276. The active detuning circuit can include a diode switch to allow detuning (switching off) of the corresponding multiturn coil when needed, such as during an RF transmit phase. Matching capacitor 274 can be utilized to match the impedance of the multiturn coil to that of the input impedance of the preamplifier to improve power transfer and/or reduce signal reflection. The preamplifier can then amplify the RF signal received from the multiturn loops and provide the amplified signals to an image reconstruction system. Similar electronic elements are depicted as associated with the second multiturn loop 230 and the third multiturn loop 240.

While FIG. 2A illustrates various electronic elements for tuning/isolation (e.g., capacitors, inductors, diodes, etc.) at particular places in the RF coil assembly, it is understood that such depictions are examples only and that the described elements may be at different places in the RF coil assembly.

In yet other embodiments, multiturn loops can be electromagnetically isolated from each other by utilizing preamplifier isolation. Mismatched amplifiers can include, for example, amplifiers as shown in FIG. 2A. By causing the overall electronic circuit of a given multiturn loop to be different than other multiturn loops, their ability to electromagnetically couple can be diminished.

Certain embodiments of the multiturn loops can form a phased array coil. Phased-array applications for such RF coil assemblies can provide improved signal-to-noise over single coils or switchable coil arrays as the RF signals from numerous coils in a phased-array coil can be combined. In such phased-array applications, some embodiments of an RF coil assembly can include a first multiturn loop adjacent to and electromagnetically isolated from a second multiturn loop. Examples of isolation techniques have been previously described herein, however, some specific embodiments can include a capacitor between the first multiturn loop and the second multiturn loop to provide the electromagnetic isolation.

Figure 2B:
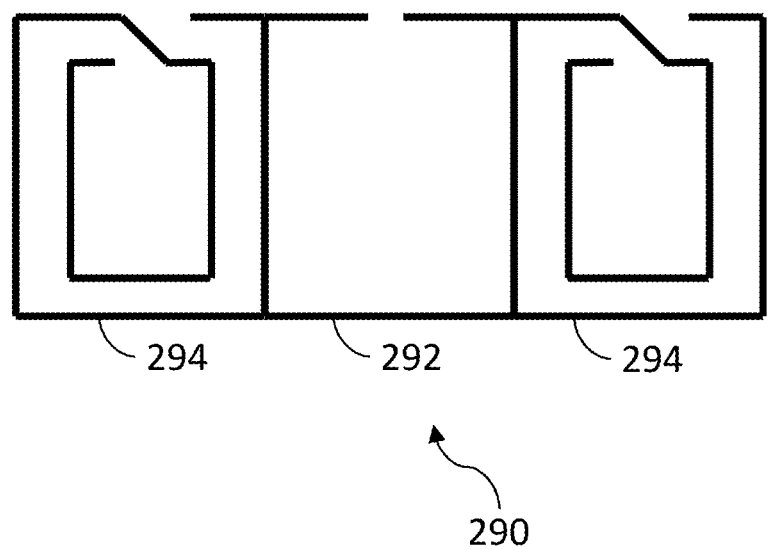
FIG. 2B illustrates one implementation of an RF coil assembly combining a single-turn loop with multiturn loops consistent with certain aspects of the present disclosure.

FIG. 2B illustrates one implementation of an RF coil assembly combining a single-turn loop with multiturn loops consistent with certain aspects of the present disclosure. Certain embodiments can include one or more single-turn loops 292 in the RF coil assembly 290 in addition to any number of multiturn loops 294. A single-turn loop can provide a larger aperture between conductors, such as to allow access for a patient's face (for a head coil) or other anatomy (for a surface coil). In FIG. 2B, a single-turn loop is shown in the plane of the RF coil assembly similar to the multiturn loops. In some embodiments, as in FIG. 2B, a single-turn loop can be disposed between two of the multiturn loops. In other embodiments, a single-turn loop can be on an end of the RF coil assembly. Thus, there can be any number of single-turn loops disposed anywhere throughout the RF coil assembly.

Figure 3A:
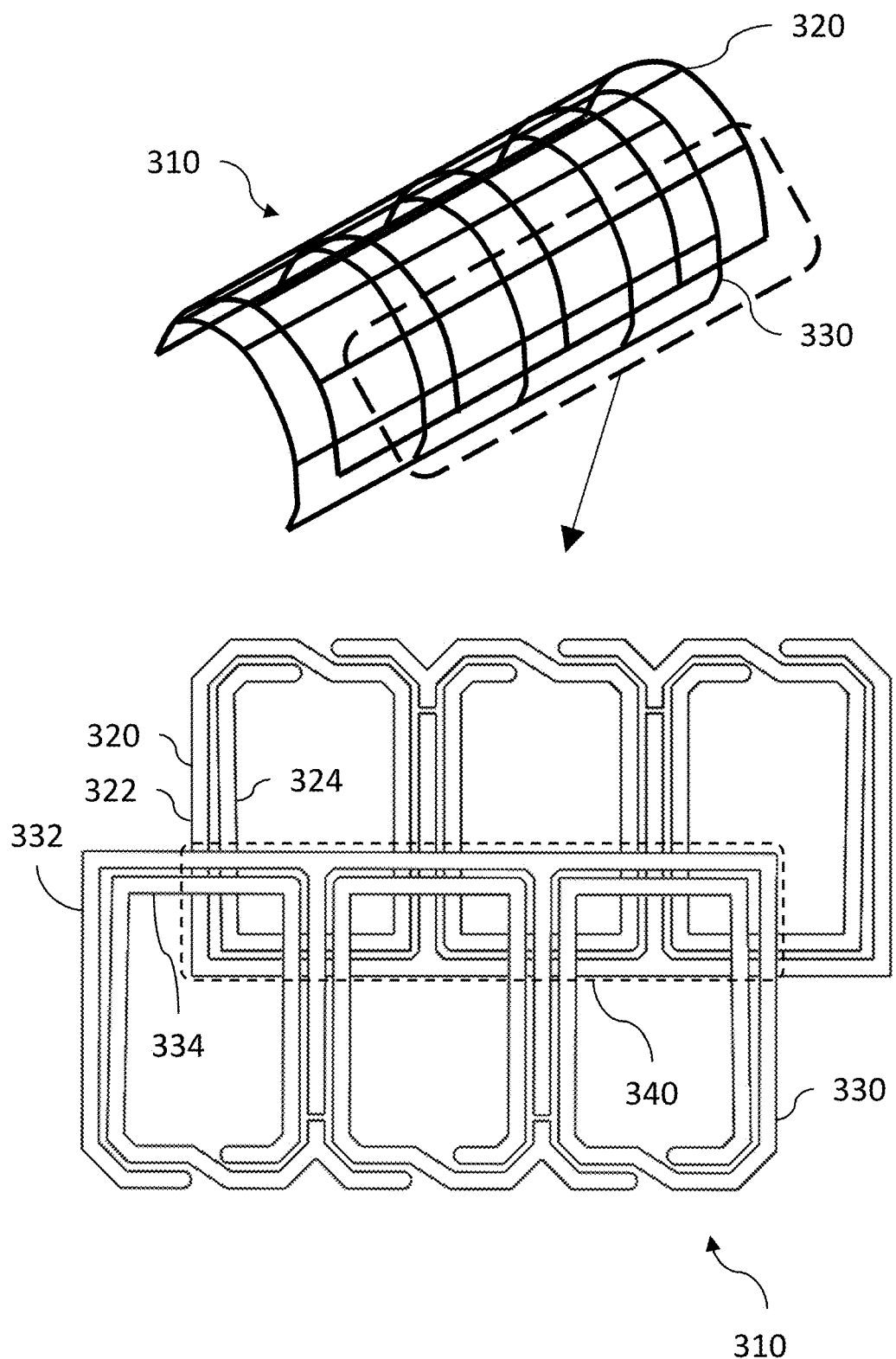
FIG. 3A illustrates a surface coil implementation of an RF coil assembly consistent with certain aspects of the present disclosure.

FIG. 3A illustrates a surface coil implementation of an RF coil assembly consistent with certain aspects of the present disclosure. In FIG. 3A, RF coil assembly 310 is part of the surface coil, which can be similar to coil 130 shown in FIG. 1. A portion of the surface coil 310 is shown in greater detail in the bottom portion of FIG. 3A.

In some embodiments, multiple RF coil assemblies can be utilized and can include overlap isolation. For example, as shown in FIG. 3A, surface coil 310 can include an RF coil assembly 320 having a plurality of multiturn loops and a second RF coil assembly 330 having a second plurality of multiturn loops and the second RF coil assembly can be at least partially overlapping the plurality of multiturn loops in the RF coil assembly. Specifically, each of the second plurality of multiturn loops can include a second inner loop 334 and a second outer loop 332. As shown in FIG. 3A, the outer loops 322 at least partially overlap an adjacent second outer loop 332 and each of the inner loops 324 at least partially overlap an adjacent second inner loop 334. The overlap region 340 can provide electromagnetic isolation between RF coil assembly 320 and the second RF coil assembly 330. In certain embodiments, any of the RF coil assemblies in surface coil 310 can include other features of RF coil assembly 210 such as decoupling electronics, common conductors, etc. The multiturn loops of each of the RF coil assemblies in this embodiment are still considered to be planar since the layering/overlap is between separate RF coil assemblies.

Figure 3B:
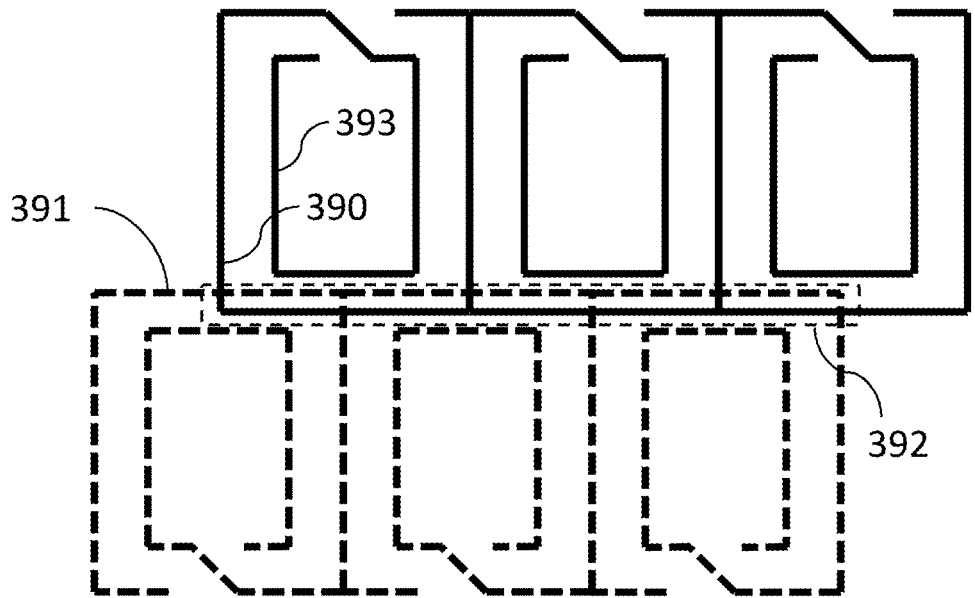
FIG. 3B illustrates an implementation of overlap isolation in an RF coil assembly consistent with certain aspects of the present disclosure.

FIG. 3B illustrates an implementation of overlap isolation in an RF coil assembly consistent with certain aspects of the present disclosure. The embodiments in FIG. 3B are similar to that shown in FIG. 3A but illustrate alternative overlapping schemes. FIG. 3B depicts one embodiment where the outer loops 390 at least partially overlap an adjacent second outer loop 391 to form overlap region 392. Inner loop 393 is not overlapped. The second plurality of multiturn loops of the second RF coil assembly is shown in dashed line for illustrative purposes to distinguish from the other RF coil assembly. Though only one pair of loops are labelled, FIG. 3B shows that the disclosed overlapping can be extended to any number of loops.

Figure 3C:
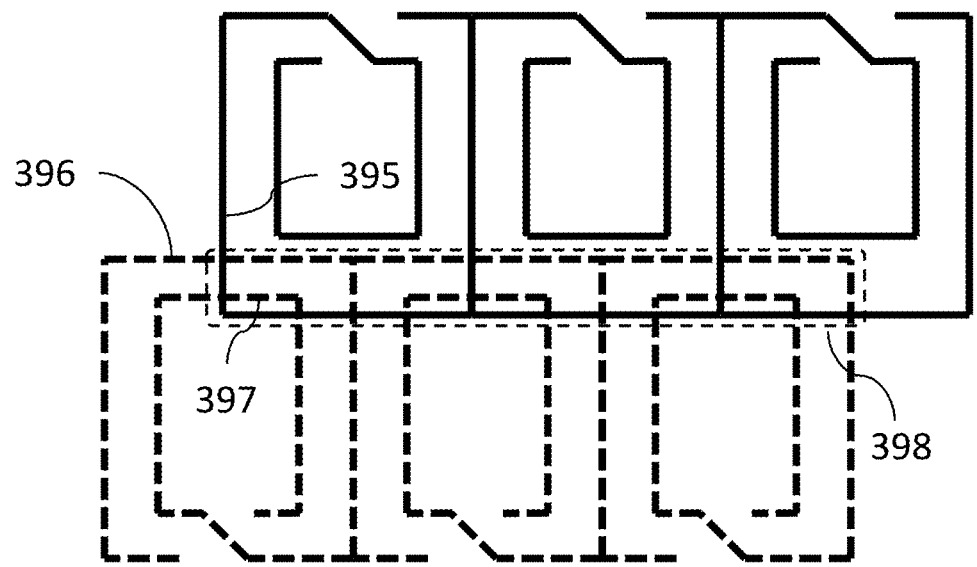
FIG. 3C illustrates another implementation of overlap isolation in an RF coil assembly consistent with certain aspects of the present disclosure.

FIG. 3C illustrates another implementation of overlap isolation in an RF coil assembly consistent with certain aspects of the present disclosure. In FIG. 3C, outer loops 395 at least partially overlap an adjacent second outer loop 396 and an adjacent second inner loop 397 to form overlap region 398. The overlapping schemes in FIGS. 3A, 3B, and 3C can be utilized in any embodiments of the RF coil assemblies disclosed herein.

Figure 4:
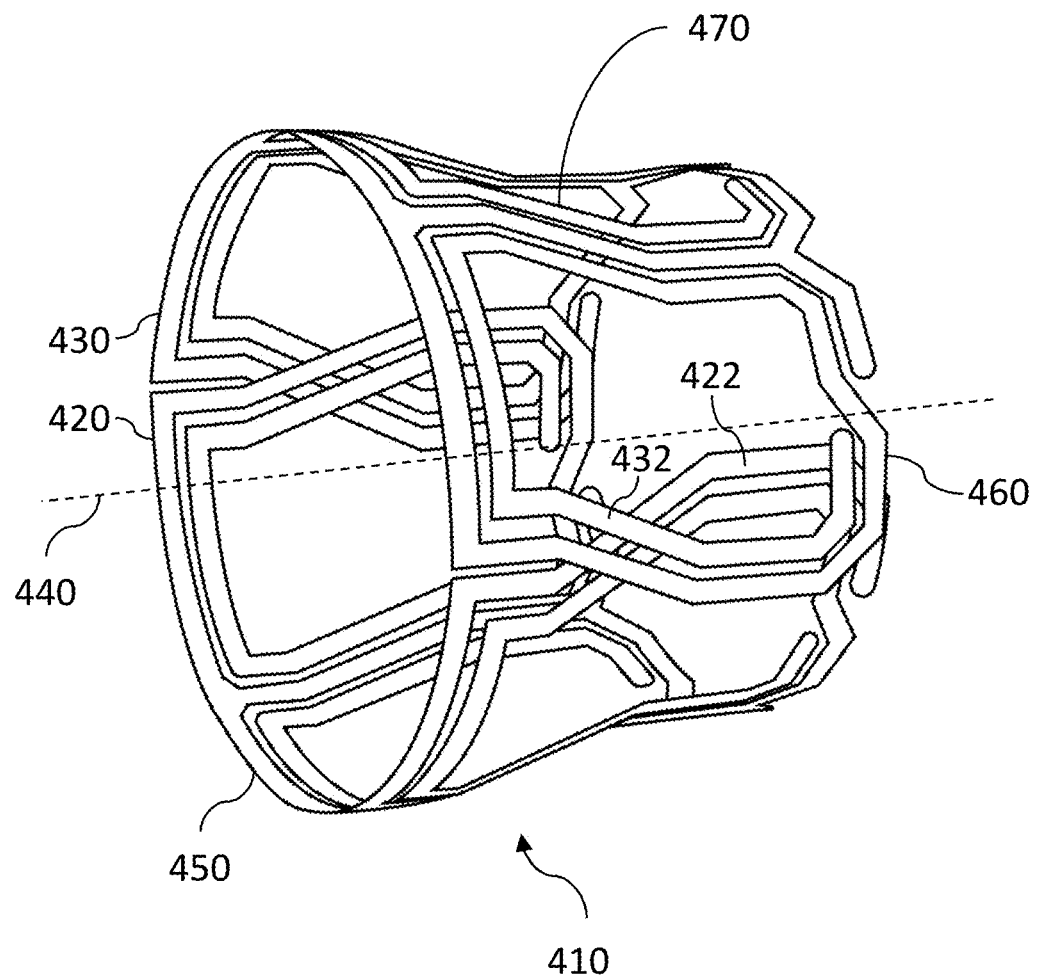
FIG. 4 illustrates a head coil implementation of an RF coil assembly consistent with certain aspects of the present disclosure.

FIG. 4 illustrates a head coil implementation of an RF coil assembly consistent with certain aspects of the present disclosure. Similar to the surface coil embodiment discussed above, head coil 410 can include one or more RF coil assemblies. The implementation depicted in FIG. 4 has a first RF coil assembly 420 and a second RF coil assembly 430, but in general may include any number of RF coil assemblies. In some implementations, the multiturn loops can be formed as generally cylindrical around an axis 440 such that the head coil has a proximal end 450 and a distal end 460. However, embodiments of the head coil can also be constructed to be generally rectangular, hexagonal, octagonal (as shown in the design depicted in FIG. 5), etc.

Certain embodiments may have a larger radius at the proximal end 450 than at a distal end 460. As used herein, "proximal end" refers to a portion of the head coil intended to be closer to the bottom of the patient's head or neck. The term "distal end" refers to the portion of head coil intended to be closer to the top of a patient's head. In some embodiments, the radii at a particular location of the head coil can be selected to provide a generally conformal fit to a patient's head. Thus, the variation in radii along the axis can vary to result in a dome shape, a frustrum shape, etc. In other embodiments, the radii can be selected to at least partially counteract a magnetic field falloff in the axial direction. Accordingly, some implementations may include a taper 470 in the RF coil assembly that causes the radius to taper either inwardly or outwardly along the axis of the head coil.

Some embodiments of the RF coil assemblies disclosed herein can include isolation by virtue of overlapping separate RF coil assemblies. For example, in the head coil embodiment of FIG. 4, a first multiturn loop 422 of the multiturn loops in RF coil assembly 420 and a second multiturn loop 432 in the second RF coil assembly 430 overlap in some locations similar to that depicted in FIG. 3A, 3B or 3C. While the overlap region(s) may be in any location(s) about axis 440, in some embodiments such as the one in FIG. 4, the overlap regions and their corresponding overlapping conductors may be located on the sides of the head coil. Such implementations can facilitate improved delivery of radiation through the head coil as many modes of radiation delivery may be primarily from the above the patient rather than from the sides or bottom.

In other embodiments, capacitors or other isolation electronics can be utilized rather than overlapping. Accordingly, in such embodiments, a first multiturn loop of the multiturn loops in the first RF coil assembly and a second multiturn loop in the second RF coil assembly may not overlap. One or more capacitors can then be connected between the RF coil assembly and the second RF coil assembly to provide electromagnetic isolation.

Figure 5:
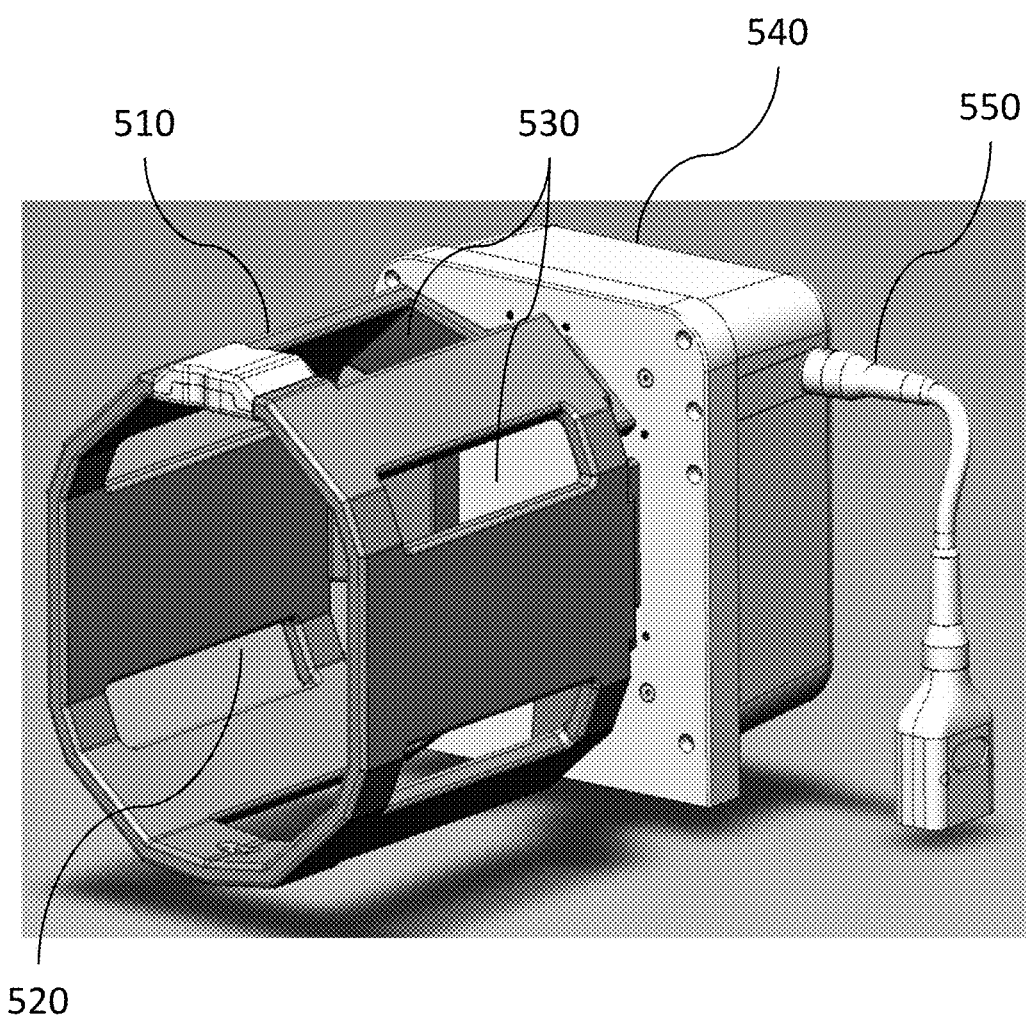
FIG. 5 illustrates a coil housing for a head coil consistent with certain aspects of the present disclosure.

FIG. 5 illustrates a coil housing for a head coil consistent with certain aspects of the present disclosure. In some implementations, portions of the RF coil assembly may be contained at least partially in a coil housing 510. For example, any or all of the multiturn loops may be within and protected by the coil housing. In some embodiments, the coil housing can include a coil housing having an opening 520 to allow access by a head of the patient. The multiturn loops of the RF coil assembly may be housed at least partially by the coil housing.

The RF coil assembly conductors may be employed on a foamed flex PCB, which is a material that has a reduced radiation attenuation efficient as compared to many other plastics. In some embodiments, the coil housing can be rigid plastic, rubber, etc. As depicted in the example of FIG. 5, the conductors are contained within the housing but there may also be one or more spaces 530 through the coil housing. However, in other embodiments, the coil housing may substantially surround the head of the patient without spaces. In some cases, the coil housing may then be configured to uniformly attenuate a radiation beam regardless of the angle through which the radiation beam is delivered. Such a configuration can be realized by utilizing appropriate combinations of materials such that there is a substantially equal attenuation of a beam whether or not the beam is going through a conductor.

Consistent with other implementations disclosed herein, the electronics for decoupling and/or amplifying RF signals can be located in an electronics housing 540. Electronics housing 540 may be of a different material than the coil housing 510. For example, to provide electrical and/or magnetic shielding, electronics housing can be made of metal foils, plates, etc. Electronics housing may also have cables 550 or feedthroughs to provide power to electronic system such as the amplifiers and may also permit outgoing signals to be transmitted to other portions of the MRI system.

Figure 6:
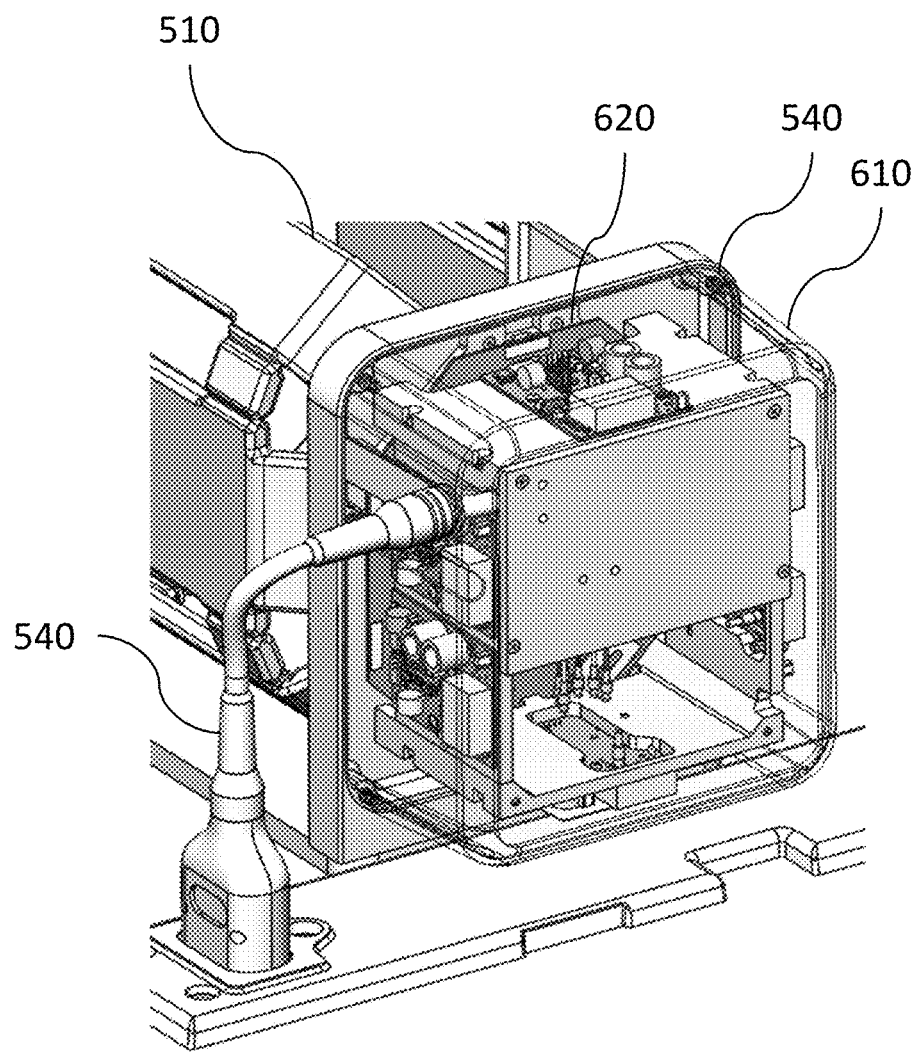
FIG. 6 illustrates an internal view of an electronics housing for a head coil consistent with certain aspects of the present disclosure.

FIG. 6 illustrates an internal view of an electronics housing for a head coil consistent with certain aspects of the present disclosure. In FIG. 6, a rear view of electronics housing 540 is depicted with an outer shell 610 drawn as transparent to allow viewing of various electronics components contained therein. In particular, to facilitate mounting of various electronic components such as for amplifiers for the RF coil assembly, a circuit board 620 can be disposed within the electronics housing and shaped to permit a substantially equal geometric distribution of the electronics utilized for each of the multiturn coils in the RF coil assembly. This may be seen in FIG. 6 by the approximately octagonal shape of the RF coil assembly (obscured by coil housing 510) and the similar octagonal shape of circuit board 620.

In the following, further features, characteristics, and exemplary technical solutions of the present disclosure will be described in terms of items that may be optionally claimed in any combination:

Item 1: An RF coil assembly comprising: a plurality of multiturn loops formed of conductors configured to receive RF signals from a patient during MRI, each of the plurality of multiturn loops comprising an inner loop and an outer loop that both lie substantially in a plane of the RF coil assembly, the inner loop at least partially nested within the outer loop.

Item 2: An RF coil assembly of any one of the preceding Items, wherein the inner loop and the outer loop form a spiral shape.

Item 3: An RF coil assembly of any one of the preceding Items, wherein the inner loop and the outer loop within a multiturn loop are arranged in series.

Item 4: An RF coil assembly of any one of the preceding Items, wherein the inner loop being nested within the outer loop increases the inductance of the RF coil assembly.

Item 5: An RF coil assembly of any one of the preceding Items, the plurality of multiturn loops comprising a first multiturn loop and a second multiturn loop, wherein the outer loops in each are at least partially formed from a common conductor.

Item 6: An RF coil assembly of any one of the preceding Items, wherein at least one of the plurality of multiturn loops further comprises a third loop at least partially nested within the inner loop.

Item 7: An RF coil assembly of any one of the preceding Items, further comprising: a first multiturn loop and a second multiturn loop that is adjacent the first multiturn loop, wherein the outer loops in each are at least partially formed from a common conductor; and a passive isolation circuit disposed in the common conductor to electromagnetically isolate the first multiturn loop and the second multiturn loop.

Item 8: An RF coil assembly of any one of the preceding Items, further comprising: a first multiturn loop and a third multiturn loop that is not adjacent the first multiturn loop; and an inductor pair connected between the first multiturn loop and the third multiturn loop to electromagnetically isolate the first multiturn loop and the third multiturn loop.

Item 9: An RF coil assembly of any one of the preceding Items, wherein the plurality of multiturn loops form a phased array coil.

Item 10: An RF coil assembly of any one of the preceding Items, wherein a first multiturn loop of the plurality of multiturn loops is adjacent a second multiturn loop of the plurality of multiturn loops, but electromagnetically isolated.

Item 11: An RF coil assembly of any one of the preceding Items, further comprising a capacitor between the first multiturn loop and the second multiturn loop to provide the electromagnetic isolation.

Item 12: An RF coil assembly of any one of the preceding Items, further comprising a single-turn loop in the plane of the RF coil assembly.

Item 13: An RF coil assembly of any one of the preceding Items, wherein the single-turn loop is disposed between two of the plurality of multiturn loops.

Item 14: An RF coil assembly of any one of the preceding Items, wherein the RF coil assembly is part of a surface coil.

Item 15: An RF coil assembly of any one of the preceding Items, wherein the surface coil further comprises a second RF coil assembly having a second plurality of multiturn loops and the second RF coil assembly at least partially overlapping the plurality of multiturn loops.

Item 16: An RF coil assembly of any one of the preceding Items, wherein each of the second plurality of multiturn loops comprises a second inner loop and a second outer loop, and wherein each of the outer loops at least partially overlap an adjacent second outer loop and wherein each of the inner loops at least partially overlap an adjacent second inner loop.

Item 17: An RF coil assembly of any one of the preceding Items, wherein each of the second plurality of multiturn loops comprises a second inner loop and a second outer loop, and wherein each of the outer loops at least partially overlap an adjacent second outer loop.

Item 18: An RF coil assembly of any one of the preceding Items, wherein each of the second plurality of multiturn loops comprises a second inner loop and a second outer loop, and wherein each of the outer loops at least partially overlap an adjacent second outer loop and an adjacent second inner loop.

Item 19: An RF coil assembly of any one of the preceding Items, wherein the RF coil assembly is part of a head coil.

Item 20: An RF coil assembly of any one of the preceding Items, wherein the plurality of multiturn loops is formed circularly around an axis and has a larger radius at a proximal end than at a distal end.

Item 21: An RF coil assembly of any one of the preceding Items, wherein the head coil further comprises a second RF coil assembly having a second plurality of multiturn loops and the second RF coil assembly at least partially overlapping the plurality of multiturn loops.

Item 22: An RF coil assembly of any one of the preceding Items, the head coil comprising: a second RF coil assembly, wherein a first multiturn loop of the plurality of multiturn loops and a second multiturn loop in the second RF coil assembly do not overlap; and a capacitor connected between the RF coil assembly and the second RF coil assembly to provide electromagnetic isolation.

Item 23: An RF coil assembly of any one of the preceding Items, further comprising a flexible foam housing having an opening to allow access by a head of the patient, wherein the plurality of the multiturn loops are housed at least partially by the flexible foam housing.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, computer programs and/or articles depending on the desired configuration. Any methods or the logic flows depicted in the accompanying figures and/or described herein do not necessarily require the particular order shown, or sequential order, to achieve desirable results. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. The implementations described above can be directed to various combinations and subcombinations of the disclosed features and/or combinations and subcombinations of further features noted above. Furthermore, above described advantages are not intended to limit the application of any issued claims to processes and structures accomplishing any or all of the advantages.

Additionally, section headings shall not limit or characterize the invention(s) set out in any claims that may issue from this disclosure. Further, the description of a technology in the "Background" is not to be construed as an admission that technology is prior art to any invention(s) in this disclosure. Neither is the "Summary" to be considered as a characterization of the invention(s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention(s), and their equivalents, that are protected thereby.

What is claimed is:

1. An RF coil assembly comprising:
a plurality of multiturn loops formed of conductors configured to receive RF signals from a patient during MRI, each of the plurality of multiturn loops comprising an inner loop and an outer loop that both lie substantially in a plane of the RF coil assembly, the inner loop at least partially nested within the outer loop, the plurality of multiturn loops including a first multiturn loop and a third multiturn loop that is not adjacent the first multiturn loop; and
an inductor pair connected between the first multiturn loop and the third multiturn loop to electromagnetically isolate the first multiturn loop and the third multiturn loop.

2. The RF coil assembly of claim 1, wherein the inner loop and the outer loop form a spiral shape.

3. The RF coil assembly of claim 1, wherein the inner loop and the outer loop within a multiturn loop are arranged in series.

4. The RF coil assembly of claim 1, wherein the inner loop being nested within the outer loop increases the inductance of the RF coil assembly.

5. The RF coil assembly of claim 1, the plurality of multiturn loops comprising a first multiturn loop and a second multiturn loop, wherein the outer loops in each are at least partially formed from a common conductor.

6. The RF coil assembly of claim 1, wherein at least one of the plurality of multiturn loops further comprises a third loop at least partially nested within the inner loop.

7. The RF coil assembly of claim 1, further comprising:
a second multiturn loop that is adjacent the first multiturn loop, wherein the outer loops in each are at least partially formed from a common conductor; and
a passive isolation circuit disposed in the common conductor to electromagnetically isolate the first multiturn loop and the second multiturn loop.

8. The RF coil assembly of claim 1, wherein the plurality of multiturn loops form a phased array coil.

9. The RF coil assembly of claim 1, wherein the first multiturn loop of the plurality of multiturn loops is adjacent a second multiturn loop of the plurality of multiturn loops, but electromagnetically isolated.

10. The RF coil assembly of claim 9, further comprising a capacitor between the first multiturn loop and the second multiturn loop to provide the electromagnetic isolation.

11. The RF coil assembly of claim 1, wherein the RF coil assembly is part of a surface coil.

12. The RF coil assembly of claim 11, wherein the surface coil further comprises a second RF coil assembly having a second plurality of multiturn loops and the second RF coil assembly at least partially overlapping the plurality of multiturn loops.

13. The RF coil assembly of claim 12, wherein each of the second plurality of multiturn loops comprises a second inner loop and a second outer loop, and wherein each of the outer loops at least partially overlap an adjacent second outer loop and wherein each of the inner loops at least partially overlap an adjacent second inner loop.

14. The RF coil assembly of claim 12, wherein each of the second plurality of multiturn loops comprises a second inner loop and a second outer loop, and wherein each of the outer loops at least partially overlap an adjacent second outer loop.

15. The RF coil assembly of claim 12, wherein each of the second plurality of multiturn loops comprises a second inner loop and a second outer loop, and wherein each of the outer loops at least partially overlap an adjacent second outer loop and an adjacent second inner loop.

16. The RF coil assembly of claim 1, wherein the RF coil assembly is part of a head coil.

17. The RF coil assembly of claim 16, wherein the plurality of multiturn loops is formed circularly around an axis and has a larger radius at a proximal end than at a distal end.

18. The RF coil assembly of claim 16, wherein the head coil further comprises a second RF coil assembly having a second plurality of multiturn loops and the second RF coil assembly at least partially overlapping the plurality of multiturn loops.

19. The RF coil assembly of claim 16, the head coil comprising:
a second RF coil assembly, wherein the first multiturn loop of the plurality of multiturn loops and a second multiturn loop in the second RF coil assembly do not overlap; and
a capacitor connected between the RF coil assembly and the second RF coil assembly to provide electromagnetic isolation.

20. The RF coil assembly of claim 16, further comprising a flexible foam housing having an opening to allow access by a head of the patient, wherein the plurality of the multiturn loops are housed at least partially by the flexible foam housing.

21. An RF coil assembly comprising:
a plurality of multiturn loops formed of conductors configured to receive RF signals from a patient during MRI, each of the plurality of multiturn loops comprising an inner loop and an outer loop that both lie substantially in a plane of the RF coil assembly, the inner loop at least partially nested within the outer loop, and
a single-turn loop in the plane of the RF coil assembly.

22. The RF coil assembly of claim 21, wherein the single-turn loop is disposed between two of the plurality of multiturn loops.

23. The RF coil assembly of claim 21, wherein the RF coil assembly is part of a head coil and the plurality of multiturn loops is formed circularly around an axis and has a larger radius at a proximal end than at a distal end.

24. The RF coil assembly of claim 21, the plurality of multiturn loops comprising a first multiturn loop and a second multiturn loop, wherein the outer loops in each are at least partially formed from a common conductor.

25. The RF coil assembly of claim 21, further comprising a flexible foam housing having an opening to allow access by a head of the patient, wherein the plurality of the multiturn loops are housed at least partially by the flexible foam housing.

* * * * *